United States Patent [19]

Ljung et al.

[11] 4,267,478
[45] May 12, 1981

[54] PATHLENGTH CONTROLLER FOR A RING LASER GYROSCOPE

[75] Inventors: Bo H. G. Ljung, Wayne, N.J.; Charles J. Williams, Carmel, N.Y.

[73] Assignee: The Singer Company, Little Falls, N.J.

[21] Appl. No.: 961,572

[22] Filed: Nov. 17, 1978

[51] Int. Cl.³ .................................... H01L 41/08
[52] U.S. Cl. ........................... 310/315; 310/317; 356/350
[58] Field of Search ............... 310/314–317, 310/328, 330–332; 356/350; 331/94.5 R, DIG. 1

[56] References Cited

U.S. PATENT DOCUMENTS

| | | | |
|---|---|---|---|
| 3,373,650 | 3/1968 | Kelpatrick | 356/350 |
| 3,467,472 | 9/1969 | Kelpatrick | 356/350 |
| 3,555,453 | 5/1968 | Littaure | 310/317 X |
| 3,719,838 | 3/1973 | Peduto et al. | 310/315 |
| 3,902,084 | 8/1975 | May, Jr. | 310/315 X |
| 4,099,876 | 7/1978 | Dorsman | 310/317 X |
| 4,113,387 | 9/1978 | Shutt | 310/332 X |
| 4,160,184 | 7/1979 | Ljung | 310/331 X |

Primary Examiner—Mark O. Budd
Attorney, Agent, or Firm—James C. Kesterson; Thomas W. Kennedy

[57] ABSTRACT

A method and apparatus for pre-setting the position of a piezoelectric actuator used in controlling the path length of the laser beam of a ring laser gyroscope is disclosed. The path length controller of this invention minimizes the necessary rectilinear motion of the actuator by presetting the actuator position according to the environmental or start-up temperature of the ring laser gyroscope to anticipate changes in the laser path length resulting from changes in the environmental temperature and/or self heating effect when the gyroscope is in operation.

15 Claims, 4 Drawing Figures

PATHLENGTH CONTROLLER FOR A RING LASER GYROSCOPE

BACKGROUND OF THE INVENTION

This invention relates to ring laser gyroscopes in general and more particularly to circuitry which operates in conjunction with piezoelectric actuators for providing an improved path length controller to use with ring laser gyroscopes.

Because of the complex requirements of todays military and space flight equipment, greater and greater demands are being placed on such equipment as guidance systems. Since gyroscopes represent an essential part of most such systems, these stringent demands are also required of the gyroscope itself. Therefore, over the years many types of gyroscopes have been developed to meet these increasing demands. One sophisticated modern type gyroscope is referred to as "a ring laser gyroscope". As is inherent in its name, the ring laser gyroscope uses a laser beam which travels in a closed path. Regardless of whether the closed path is triangular, square, octagon, etc., the closed path is commonly referred to as a ring. Such a ring laser gyroscope is used to detect rotation about the axis of the path around which the laser beam travels. Typical ring laser gyroscopes are disclosed in U.S. Pat. Nos. 3,373,650 and 3,467,472. Again, because of the harsh environments experienced by modern guidance systems, the ring laser gyroscope must operate over a wide range of temperatures, and as a result, the material of which a gyroscope is made suffers thermal expansion and contractions as the temperature varies. As an example, the temperature variation may range from −55° C. to +70° C. Since the laser beam of the ring laser gyroscope is normally directed along its path by means of mirrors, such thermal expansion and contraction of either of the supporting structure for the mirrors or the mirrors themselves will cause a change in the path length. Although the path followed by the laser beam or a ring laser gyroscope is commonly referred as "a ring", it will be appreciated as was mentioned before, that the path is typically of a triangular shape, since a triangular shaped path constitutes the smallest number of direction changes which can result in a closed path. In any event, regardless of whether the path of the laser beam is triangular, square or some other shape, any change in the path length due to thermal expansion or contraction, if not corrected, may well result in drift by the gyroscope. That is, the gyroscope output will indicate a rotation has occurred when in fact none actually occured. In a typical triangular ring laser gyroscope this problem is often solved by mounting one of the reflecting surfaces, typically a mirror, such that its location can be slightly varied as necessary, to maintain the path length constant even though temperature changes makes the material expand or contract. This may be accomplished by constructing one mirror or reflecting surface with a flexible annulus which is attached to a piezoelectric actuator. The piezoelectric actuator is then used to maintain the path length of the laser constant by deforming the mirror and thereby changing the position of the reflecting surface. The piezoelectric actuator operates in response to detected changes in the ring laser path length, and thus a closed loop serve system is obtained.

The ring laser gyroscope shown and described in U.S. Pat. Nos. 3,373,650 and 3,467,472 include a triangular block which forms a triangular shaped ring laser cavity defined by mirrors at the three corners. It will be appreciated that the triangular-shaped block is preferred since it requires a minimum number of mirrors. The laser cavity itself is filled by a gas which comprises, for example, helium and neon. The laser usually operates at one of two wave lengths; specifically either at 1.15 micrometers in the infrared spectral band or at 0.63 micrometers in the visible wave length region. Through proper choice of the ratios of the two neon isotopes $Ne^{20}$ and $Ne^{22}$ in the gas mixture, two monochromatic laser beams are created. The two laser beams respectively travel in clockwise and counterclockwise directions around the triangular cavity in the same closed optical path.

With no angular motion about the input axis of the ring laser gyroscope, the lengths of the two laser beams are equal, and the two optical frequencies are the same. Angular movement in either direction about its input axes, however, causes an apparent increase in the cavity length for the beam travelling in the direction of such angular movement and a corresponding decrease for the beam travelling in the opposite direction. Because the closed optical path is a resonant cavity providing substained oscillation, the wave length of each beam must also be increased or decreased accordingly. Angular movement of the ring laser gyroscope in either direction about its input axes, therefore, causes a frequency differential to occur between the two beam frequencies which is proportional to the angular rate.

In accordance with the prior art practice, the two beams are extracted from the laser at its output mirror and they are heterodyned in a beam combiner to produce an interference pattern. The interference pattern is detected by a photodetector which senses the beam frequency of the heterodyned optical frequencies of the two beams, and this beam frequency is the measure of the angular rate.

However, regardless of whether a ring laser gyroscope of a type just discussed or even another method is used, as was discussed heretofore, the ring laser gyroscope must be capable of operating over a wide range of temperatures.

Typically, the piezoelectric actuators used to maintain the path length of the laser are designed to control the path length to an integral number of laser wave lengths. It is usually necessary that an actuator at least have the ability to change the flexible mirror five free spectral ranges, e.g., to change the ring laser gyroscope from one resonance to a fifth higher or lower resonance. For operation with visible red helium-neon laser wavelengths, this means the mirror must be able to move at least $$\Delta L = \frac{5 \times 0.6328 \times 10^{-6}}{\sqrt{3}} \text{ meters.} \quad (1)$$

Even though ultra-low expansion materials such as Schott Zerodur and Cervit 101 by Owens Illinois Corporation is used, the path length of a ring laser gyroscope will still experience a substantial change in the path length when experiencing a temperature change from −55° C. to +70° C. For example, if Schott Zerodur is used (expansion coefficient $\alpha = -8 \times 10^{-8}/°C.$), the path length of a ring laser gyroscope having a typical roundtrip path length of 0.32 meters will experience a change in the path length by $-3.2 \times 10^{-6}$ meters for such a temperature change. That is, the path length will be decreased or shortened by that amount. Such a length change corresponds to 5 λ (i.e. five wave length) with operation of the laser in the visible helium-neon transition. When the ring laser, using a prior art path length controller, is turned on at for example −55° C., the initial voltage input to the actuator will probably be on the order of 0 volts. Furthermore, if as in the usual situation we assume the worst case condition, that the closed loop system locks on by increasing the total path length one-half free spectral range at 55° C. it will be appreciated that the servo has used up this part of its total range. This will of course necessitate increasing the total range by one-half free spectral range. Therefore, the prior art necessary range of a piezoelectric actuator is $$\Delta L = \frac{(5 + \frac{1}{2}) \times 0.6328 \times 10^{-6}}{\sqrt{3}} = 2.0 \times 10^{-6} \text{ meters} \quad (2)$$

A comparison of equation (2) with equation (1) above, shows the increase of the one-half free spectral range. Modern piezoelectric materials are typically capable of changing their thickness according to the formula $$\Delta L/L = 200 \times 10^{-6} \quad (3)$$

at full applied voltage. Therefore, combining equation (2) and equation (3), it is seen that the required total thickness of a stack of piezoelectric discs is $$L = \frac{2.0 \times 10^{-6}}{200 \times 10^{-6}} = 0.01 \text{ meters} \quad (4)$$

Although as will be discussed later, there are specifically designed piezoelectric discs which may be considered "double acting" and therefore can reduce the length arrived at an equation (4) to one-half the normal value (or 0.005 meters) it will be appreciated that in any case, all of the prior art piezoelectric actuators essentially use only about one-half of the total available stroke when the initial voltage input to the actuator is 0 volts and the actuators closed loop system locks on as described above. This is because, as will be explained hereinafter, only one polarity of the piezoelectric actuator stack is used. Use of only one polarity and consequently one-half of the available stroke of the piezoelectric actuator stack presents a serious problem on how to compensate for such changes due to temperature. This means that either the temperature range must be limited or the thermal expansion coefficient must be kept even smaller than is now achieved by the ultra-low coefficient of expansion material now being used in ring laser gyroscopes. Alternately, the stroke of the piezoelectric actuator must be so large as to necessitate the use of an extremely thin flexible annular area or membrane in the mirror and perhaps the use of a bimorph piezoelectric actuator. It will be appreciated by those skilled in the art that a bimorph actuator acts similar to a bimetal system but is made of piezoelectric material with radially expanding discs. Typically, one expanding disc and one contracting disc is used. Unfortunately, such an arrangement has extremely low stiffness and if used in ring laser gyroscopes the membrane or thin annular ring in the mirror must be no greater than 0.4 millimeters. It will also be appreciated that such thinness greatly increases the price and the risk of mechanical failure. These choices obviously are just not satisfactory. For example, if a large stroke piezoelectric actuator is used (i.e. $L = 0.01$ meters) it is quite possible the overall size of the ring laser gyroscope must be increased to the point it will be necessary to have a larger package around the unit. Furthermore, since piezoelectric discs are quite expensive, and since many more discs will be required if the length is increased, the overall price will be excessive. On the other hand, use of an extremely thin flexible mirror with a bimorph actuator is unacceptible since the annular area in the mirror is so expensive to manufacture because of necessary polishing, etc., and since it is sensitive to ambient pressure. In addition, such a combination arrangement is mechanically weak, subject to influence from vibrations, and is prone to unwanted simultaneous rotation as it provides the desired rectilinear motion. This simultaneous rotation will cause the laser beam inside the ring laser to shift its position with respect to the mirrors and apertures, and thus change the forward scattering in each beam. This causes the ring laser output to indicate a rotation. However, regardless of the type of piezoelectric actuator used, and regardless of the type of piezoelectric discs used, as was mentioned above, all of the present path length controllers use only about one-half of the total available stroke of the piezoelectric stack since only one polarity of the piezoelectric stack is used.

Therefore, to overcome the short comings of available methods, it is an object of this invention to provide methods and apparatus which use the full rectilinear motion available from a piezoelectric actuator to compensate for thermal expansion and contractions.

It is still another object of this invention to provide an inexpensive and simple piezoelectric actuator.

It is a further object of this invention to minimize the number of peizoelectric devices required in a piezoelectric actuator.

To accomplish the above mentioned objects as well as other objects which will become evident from the following drawings and detailed description, the present invention provides circuitry which allows substantially the entire stroke of a piezoelectric actuator to be used to accurately control a parameter which varies because of thermal expansion or contraction of a structure by presetting the stroke position of said actuator. A particular use is for accurately maintaining the path length of the laser beam of a ring laser gyroscope as a function of the startup temperature. Such circuitry comprises a temperature sensing means for determining the temperature of said structure and for providing an output representative of said temperature. The output from the temperature sensing means is received by a circuit network which provides a control signal which varies in response to the temperature sensing output and mathematical model of the expansion and contraction characteristics of the material from which the structure is made. The control signal is received by a driving means which provides the necessary driving voltage to position the piezoelectric actuator according to the value of said control signal. Once the actuator has been preset to the desired position then switching means switches the control circuitry from the presetting circuitry to the normal operating closed loop servo circuitry.

Accordingly, the above mentioned objects and subsequent discription will be more readily understood by reference to the following drawings wherein.

Figure 1:
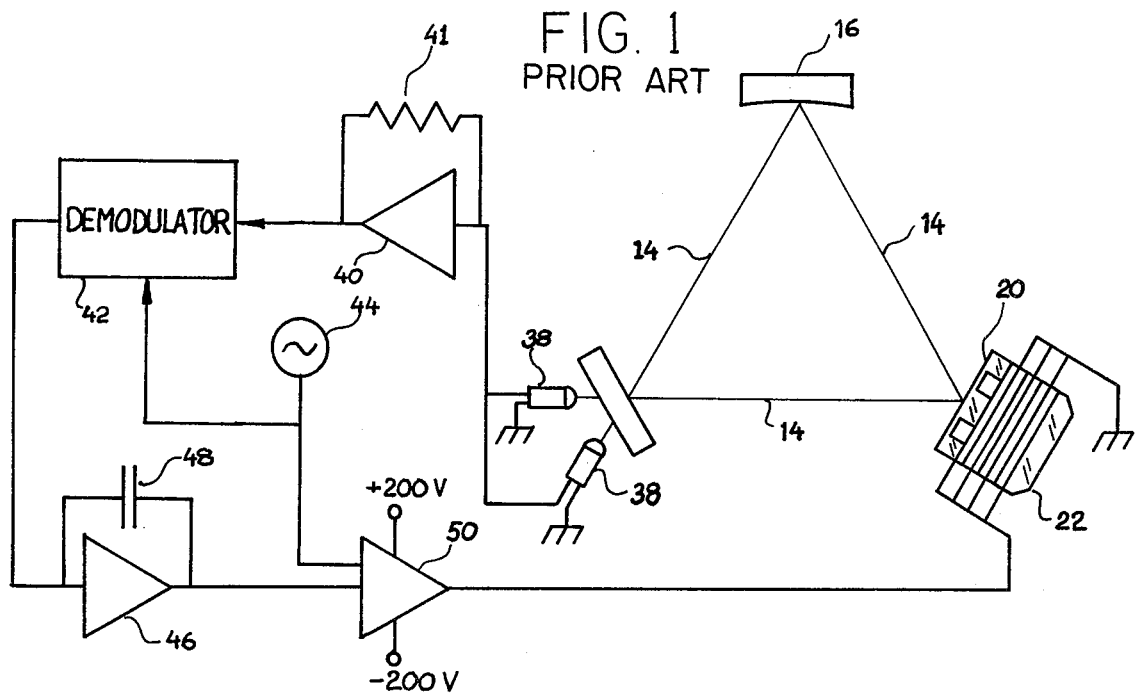
FIG. 1 is a part schematic, part block diagram representation of a prior art path length controller used by a ring laser gyroscope.
Figure 2:
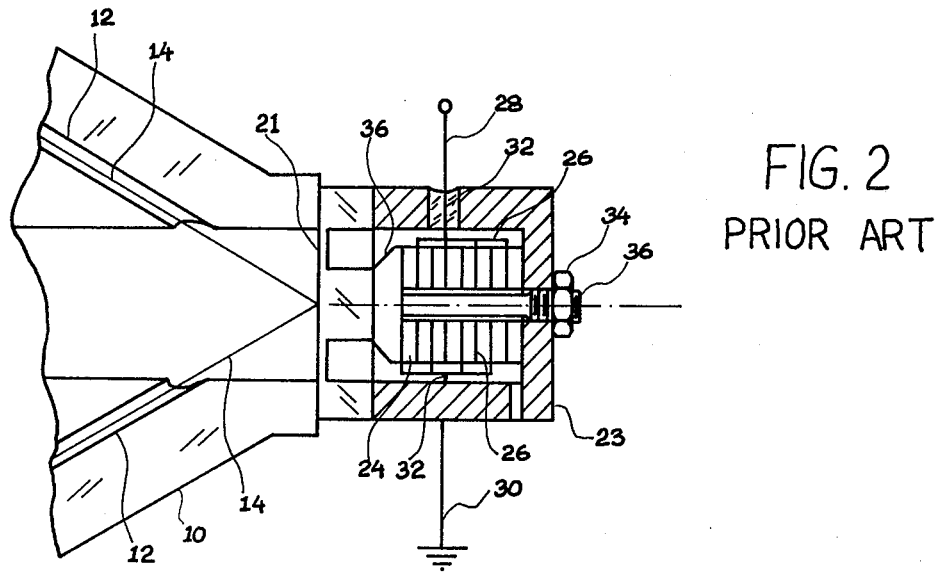
FIG. 2 is a more detailed schematic representation of a flexible mirror controlled by a piezoelectric actuator stack such as is used in the prior art path length controller of FIG. 1.
Figure 3:
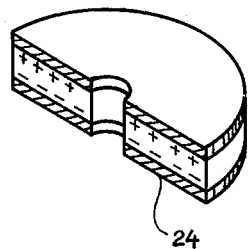
FIG. 3 is a cross-sectional perspective view of a typical prior art piezoelectric disc such as is used in the piezoelectric actuator stack of FIG. 2.

Referring now to FIG. 1 there is disclosed a prior art path length controller of the type taught in U.S. Pat. No. 3,581,227 and which is suitable for use with the present invention. FIG. 2 shows a typical actuator such as is used in the path length controller of FIG. 1. In this device the casing for the stack of piezoelectric discs comprises an extension of the mirror structure with a cover. As is shown in the Figures, ring laser casing 10 is typically made up of a material such as Schott Zerodur, Cervit 101 or the like. Casing 10 contains channels 12 through which laser beam 14 is directed. In order that laser beam 14 will travel in a closed path, mirrors 16, 18, and 20 are provided for reflecting the laser beam. Whereas curved mirror 16 and flat mirror 18 are securely mounted to avoid any shifting in relative positions, mirror 20 is made with a flexible annular area 21 to permit flexing of the mirror and consequently changes in the overall path length of the laser beam. In order to control this path length, a piezoelectric actuator indicated generally as 22 has been commonly used. As is shown, actuator 22 includes a housing 23 made of a material such as Invar to match as closely as possible the thermal expansion coefficients of casing 10. Disposed within casing 10 are a plurality of piezoelectric discs 24 such as shown in the cross-sectional perspective view of FIG. 3. As is well known by those skilled in the art, piezoelectric discs have the quality of changing their thickness in response to an applied voltage. Thus, as was shown heretofore, to obtain the desired $2.0 \times 10^{-6}$ meters of stroke as calculated in equation (2) by the use of materials which are capable of changing their thickness at a rate of $\Delta L/L = 200 \times 10^{-6}$ at full applied voltage and as was set out in equation (3) above the length of the piezoelectric stack will be approximately 0.01 meters as calculated in equation (4) (or approximately 0.4 inches). The piezoelectric stack is typically divided into a plurality of discs each of which has a thickness on the order of 0.5 millimeters (or 0.02 inches) in order to permit the use of a transistorized amplifier which typically operates at voltage which do not exceed $\pm 200V$. The voltage is applied to each face of the piezoelectric discs 24 by the use of thin metal spacers 26 which are located between each of pair of discs. The piezoelectric discs 24 are arranged such that the sides of the disc having common polarity are placed back to back (i.e. the positive side of one disc is placed next to the positive side of the adjoining disc with a spacer 26 in between) in order that when energized all discs expand and contract together. The common positive and negative leads 28 and 30 are brought out of the housing 23 through feed throughs 32. In this embodiment, the discs 24 and spacers 26 are held together by means of a nut 34 and bolt 36. The head of bolt 36 being attached by appropriate adhesive to mirror 20.

Output sensors 38 of the ring laser gyroscope are amplified by the combination of amplifier 40 and feedback resistor 41 and provided to demodulator 42. Demodulator 42 obtains a reference from the signal generator 44 which operates at a selected frequency such as, for example, two (2) kilohertz. The output of demodulator 42 is integrated by amplifier 46 and capacitor 48 before it is further amplified by high voltage amplifier 50. The output of high voltage amplifier 50 is used to drive the piezoelectric discs 24 discussed above. The output of signal generator 44 is also used as another input to high voltage amplifier 50 so as to impress the 2 KHz frequency on the signal supplied by amplifier 50 to the piezoelectric actuator 22. This causes a slight oscillation or vibration of the mirror 20 during operation. Thus, this vibration resulting from the signal from amplifier 50 will be detected by output sensors 38 and then demodulated by demodulator 42.

Copending application Ser. No. 868,067 which was filed Jan. 9, 1978 now U.S. Pat. No. 4,160,184 issued July 3, 1979 and assigned to the present assignee teaches a novel piezoelectric stack for attaching to mirror 20 which does not require the use of a casing 23, and which uses doubleacting piezoelectric discs thereby requiring fewer discs. However, although such a piezoelectric stack actuator itself is superior to that just described, because of the need for less elements, less weight and less components, the operation of the mirror and the rest of the laser cavity and ring laser gyroscope is identical and consequently still only one-half of the stroke of the piezoelectric stack is available.

Figure 4:
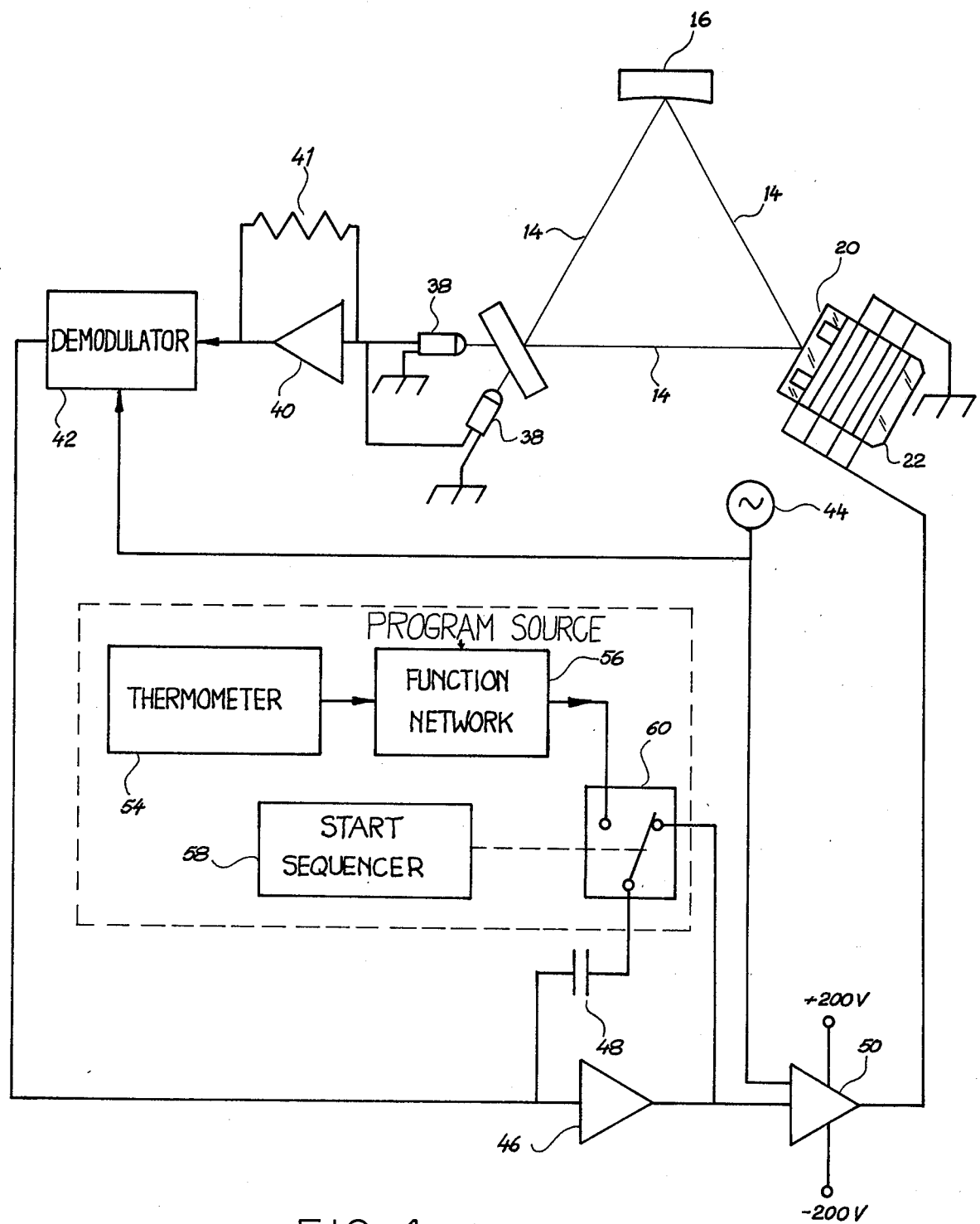
FIG. 4 is a part schematic and part block diagram representation of a path length controller, which incorporates the teachings of this invention.

Comparing FIG. 1 and FIG. 4, it is seen that the path controller circuitry of this invention shown in FIG. 4 and as described so far operates in a manner identical to that of the prior art shown in FIG. 1 except that capacitor 48 across integrating amplifier 46 in the present invention may be charged by the output of the integrating amplifier 46 as in the prior art or it may selectively be precharged prior to operation of the system by the presetting circuitry 52. According to the prior art circuitry, capacitor 48 will have a zero charge when the system is first turned on. Consequently, the output of integrating amplifier 46 will also be zero. Once the system is turned on, and the laser starts an error voltage will develop which will drive the high voltage amplifier 50 to lock on to the nearest resonance frequency of the ring laser. However, referring again to FIG. 4 and according to this invention, a thermometer 54 is included which provides an output voltage to function network 56 which is proportional to the difference between the starting temperature (that is the ambient or environmental temperature) and the center temperature of the ring laser system operating temperature range. Function network 56 contains therein a mathematical model of the expansion and contraction characteristics of the material which makes up the ring laser gyroscope. It will be appreciated that function network 56 may operate substantially as a Read Only Memory (ROM) and have the mathematical model permanently stored therein, or it may consist of a piece wise linear resistor network. Thus, depending upon the input from the thermometer, the function network 56 will provide an appropriate voltage which is used to charge capacitor 48 to a level which will vary depending upon difference between the ambient temperature and the normal operating range of $+70°$ C. For example, assuming the laser material is made of Zerodur which has a coefficient of expansion of $\lambda = -8 \times 10^{-8}/°C.$, and assuming that the start-up temperature of the gyroscope is at its minimum limit (that is −55° C.), then function network circuit 56 will provide an output of +10 volts, which after being passed through integrating amplifier 46 and High Voltage amplifier 50 will result in an output from High Voltage amplifier 50 of approximately −200 volts. Thus, in this case, the piezoelectric stack will be driven to full travel in one direction, thereby allowing full range of the piezoelectric stack i.e., −200 volts to +200 volts to be used as the temperature changes from the −55° C. starting temperature to the +70° C. operating temperature. Thus, the corrections necessary to compensate for the changes in the laser beam path length due to temperature changes will occur as the ring laser gyroscope heats up to its highest operating temperature of +70° C. Therefore, if the path length controller circuitry is designed such that the piezoelectric actuator will demand approximately the full +200 volts at temperatures close to +70° C. and the full −200 volts at temperatures close to −55° C. then it is seen that the actuator stroke is completely used. As another example, if we assume that the starting temperature was at the center temperature of the operating range (or approximately +7° C., then the output of function network 56 would be approximately 0 volts. Thus, in this case, the output of high voltage amplifier 50 will also be 0, the piezoelectric stack will be in a relaxed state and the laser cavity will start its laser action with mirror 20 in an unstressed condition.

In this invention, the output of function network 56 precharges capacitor 48 to preset the output of high voltage amplifier 50 and the stroke position of the stack of piezoelectric discs 24. However, after the laser action has started and capacitor 48 is precharged by function network 56, then start sequencer 58 will switch the input to capacitor 48 from the output of the function network 56 to the output of integrating amplifier 46. For purposes of illustration, such switching is accomplished by switch 60. Thus, once startup is achieved, and the input to capacitor 48 is switched to the output of integrating amplifier 50 the path length controller will operate as in the prior art and discussed with respect to FIG. 1 heretofore.

Thus, it will be appreciated that by the use of this invention the number of expensive piezoelectric discs which are needed to assure the necessary stroke of a piezoelectric actuator will be only half that required in the prior art. Of course, if the present invention is used in a piezoelectric stack utilizing the doubleacting piezoelectric disc as described in copending application Ser. No. 868,067, then, only one-fourth as many discs will be necessary as has been used in the past.

Although the path length controller of this invention has been disclosed as it applies to ring laser gyroscopes, it will be appreciated of course that the present invention is equally applicable to other situations where such temperature compensation is required. In addition, although the present invention has been described with respect to specific methods and apparatus for maintaining and controlling the path length of a ring laser gyroscope making maximum use of the full stroke of the piezoelectric stack, it is not intended that such specific reference be considered limitations upon the scope of the invention except insofar as is set forth in the following claims.

What is claimed is:

1. Apparatus and circuitry for permitting the use of substantially the entire stroke of a piezoelectric actuator stack used in a closed loop servo controlled apparatus by presetting the stroke position of said actuator stack as a function of the startup temperature of said controlled apparatus prior to closed loop servo operation comprising:

temperature sensing means for determining the temperature of said controlled apparatus and for providing an output signal representative of said temperature;

a function network having a mathematical model of the thermal expansion and contraction characteristics of the material from which the controlled apparatus is manufactured stored therein for receiving said output signal and for providing a control signal which varies in accordance with both said mathematical model and said output signal; and means for selectively applying and removing said control signal as an input to said closed loop servo controlled apparatus.

2. The apparatus of claim 1 wherein said mathematical model contained in said function network is provided by an external source.

3. The apparatus of claim 1 wherein said mathematical model contained in said function network is permanently stored therein.

4. The apparatus of claim 3 wherein said function network includes a Read Only Memory (ROM).

5. The apparatus of claim 1 wherein said output signal represents a change between a reference temperature and said temperature of said closed loop servo controlled apparatus.

6. The apparatus of claim 1 wherein said closed loop servo apparatus includes a driving means for controlling the position of said piezoelectric actuator and said driving means is responsive to said control signal for positioning said actuator when said control signal is applied to said closed loop servo controlled apparatus.

7. The apparatus of claim 1 wherein said closed loop servo controlled apparatus includes an intergrating amplifier and said control signal is used to precharge a capacitor across said intergrating amplifier.

8. Apparatus and circuitry for permitting the use of substantially the entire stroke of a piezoelectric actuator stack used in a closed loop servo controlled ring laser gyroscope by presetting the stroke position of said actuator stack as a function of the startup temperature of said ring laser gyroscope prior to closed loop servo operation to maintain the path length of the laser beam of said ring laser gyroscope comprising:

temperature sensing means for determining the temperature of said ring laser gyroscope and for providing an output signal representative of said temperature;

a function network having a mathematical model of the thermal expansion and contraction characteristics of the material from which the ring laser gyroscope is manufactured for receiving said output signal and for providing a control signal which varies in accordance with both said mathematical model and said output signal; and means for selectively applying and removing said control signal as an input to said closed loop servo controlled ring laser gyroscope.

9. The apparatus of claim 8 wherein said mathematical model contained in said function network is provided by an external source.

10. The apparatus of claim 1 wherein said mathematical model contained in said function network is permanently stored therein.

11. The apparatus of claim 10 wherein said function network includes a Read Only Memory (ROM).

12. The apparatus of claim 8 wherein said output signal represents a change between a reference temperature and said temperature of said ring laser gyroscope.

13. The apparatus of claim 8 wherein said closed loop servo apparatus includes a driving means for controlling the position of said piezoelectric actuator, and said driving means is responsive to said control signal for positioning said actuator when said control signal is applied to said closed loop servo controlled ring laser gyroscope.

14. The apparatus of claim 8 wherein said closed loop servo controlled ring laser gyroscope includes an intergrating amplifier and said control signal is used to precharge a capacitor across said intergrating amplifier.

15. In a closed loop servo system for use in maintaining the path length of the laser beam of a ring laser gyroscope, wherein said closed loop servo system comprises means for sensing changes in the path length of said laser beam and for providing a first signal representative of said changes; means, including an intergrating amplifier, for converting said first signal to a second signal suitable as an input to a dual polarity high-voltage driving amplifier; a high voltage driving amplifier responsive to said second input, having a dual polarity output; and a piezoelectric actuator responsive to said dual polarity output of said high voltage driving amplifier for varying the position of a mirror located in the path of said ring laser gyroscope to maintain the path length of said laser beam at a constant value the improvement comprising:

temperature sensing means for determining the temperature of said ring laser gyroscope and for providing an output signal representative of said temperature;

a function network having a mathematical model of the thermal expansion and contraction characteristics of the material from which the ring laser gyroscope is manufactured for receiving said output signal and for providing a control signal which varies in accordance with said mathematical model and said output signal, said control signal being used to precharge a capacitor across said intergrating amplifier; and means for selectively applying and removing said control signal as an input to said closed loop servo controlled ring laser gyroscope.

* * * * *